(12) United States Patent
Tseng et al.

(10) Patent No.: US 11,435,596 B2
(45) Date of Patent: Sep. 6, 2022

(54) DISPLAY PANEL AND HOLOGRAPHIC DISPLAY DEVICE

(71) Applicant: HON HAI PRECISION INDUSTRY CO., LTD., New Taipei (TW)

(72) Inventors: Te-En Tseng, New Taipei (TW); Tsai-Yi Chien, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 258 days.

(21) Appl. No.: 17/003,017

(22) Filed: Aug. 26, 2020

(65) Prior Publication Data

US 2021/0318551 A1     Oct. 14, 2021

(30) Foreign Application Priority Data

Apr. 10, 2020    (CN) .......................... 202010278061.X

(51) Int. Cl.
| | | |
|---|---|---|
| *G02B 30/26* | (2020.01) | |
| *H01L 27/15* | (2006.01) | |
| *H01L 27/32* | (2006.01) | |
| *H01L 33/50* | (2010.01) | |

(52) U.S. Cl.
CPC ............ *G02B 30/26* (2020.01); *H01L 27/156* (2013.01); *H01L 27/322* (2013.01); *H01L 27/3244* (2013.01); *H01L 33/507* (2013.01)

(58) Field of Classification Search
CPC . H01L 27/156; H01L 27/322; H01L 27/3244; H01L 33/507; H01L 25/0753; H01L 33/44; H01L 27/3211; H01L 2251/5369; G02B 30/26; G02B 2027/0134; G02B 2027/0174; G02B 27/0172

See application file for complete search history.

(56) References Cited

U.S. PATENT DOCUMENTS

| | | | |
|---|---|---|---|
| 2017/0236866 A1* | 8/2017 | Lee ...................... H01L 27/156 257/89 |
| 2019/0131350 A1* | 5/2019 | Kwak .................. H01L 27/3211 |
| 2019/0377223 A1* | 12/2019 | Lee ........................ H01L 27/322 |
| 2020/0144333 A1* | 5/2020 | Kim ................ H01L 31/035218 |
| 2020/0161579 A1* | 5/2020 | Kim ..................... H01L 51/5271 |
| 2020/0287103 A1* | 9/2020 | Maegawa ............. H01L 33/507 |
| 2021/0234112 A1* | 7/2021 | Seo ....................... H01L 51/502 |
| 2022/0085334 A1* | 3/2022 | Oh ....................... H01L 51/5275 |

FOREIGN PATENT DOCUMENTS

WO         2014107616 A1     7/2014

* cited by examiner

*Primary Examiner* — Kevin Quarterman
(74) *Attorney, Agent, or Firm* — ScienBiziP, P.C.

(57) ABSTRACT

A holographic display panel with precise control in the wavelengths of projected light, and therefore sharpness of image, includes a light source and a filter layer. The light source emits at least a first color light and a second color light. The filter layer is located on an optical path of the first color light and an optical path of the second color light. The filter layer includes first and second filter units. Each of the first filter units filters and restricts wavelengths of the first color light, each of the second filter units filters and restricts wavelengths of the second color light.

18 Claims, 4 Drawing Sheets

DISPLAY PANEL AND HOLOGRAPHIC DISPLAY DEVICE

FIELD

The subject matter herein generally relates to a holographic display.

BACKGROUND

A holographic device combines both holographic technology and waveguide technology to achieve superimposing a virtual image and an external scene image in a projected manner.

A head-mounted holographic device can be worn on user's head for showing a three-dimensional holographic image to the user. An image accuracy requirement of the head-mounted holographic display is much higher than that of the two-dimensional display (for example, TV, computer, etc.). Therefore, a coherence requirement and a narrow spectrum requirement for a light source of the holographic display are also much higher than those of the two-dimensional display. Low coherence or wide spectrum of the light source may reduce uniformity and sharpness of an image displayed by the head-mounted device. Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
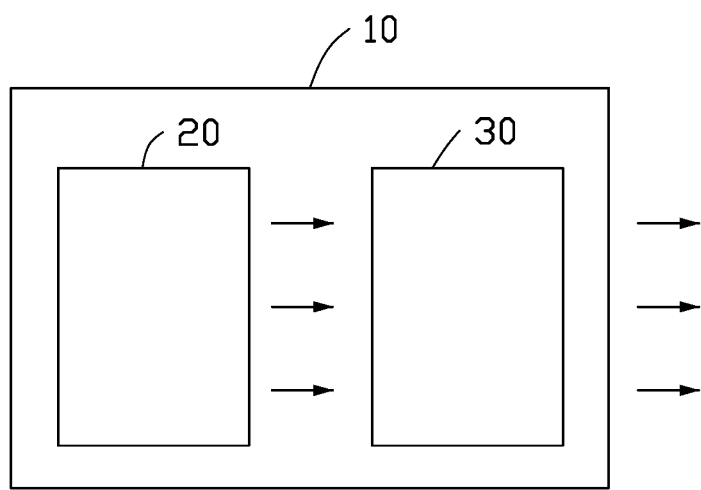
FIG. 1 is a schematic diagram of a holographic display device according to a first embodiment of the present disclosure.

It will be appreciated that for simplicity and clarity of illustration, where appropriate, reference numerals have been repeated among different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as connected, whether directly or indirectly through intervening components, and is not necessarily limited to physical connections. The connection can be such that the objects are permanently connected or releasably connected. The term "comprising" when utilized, means "including, but not necessarily limited to"; it specifically indicates open-ended inclusion or membership in the so-described combination, group, series, and the like.

This embodiment provides a holographic display device (holographic display device 10). Specifically, the holographic display device 10 is a head-mounted holographic display device. When the holographic display device 10 is worn on a user's head, a three-dimensional image can be presented.

Referring to FIG. 1, the holographic display device 10 includes a display panel 20 and a modulator 30. The display panel 20 is configured to emit a first image light. The first image light is configured to display two-dimensional images. The modulator 30 is located on an optical path of the first image light. The modulator 30 is configured to modulate the first image light to be a second image light. The second image light is configured to display three-dimensional holographic images. The modulator 30 may include a waveguide (not shown) and a diffraction grating (not shown) in one embodiment.

Figure 2:
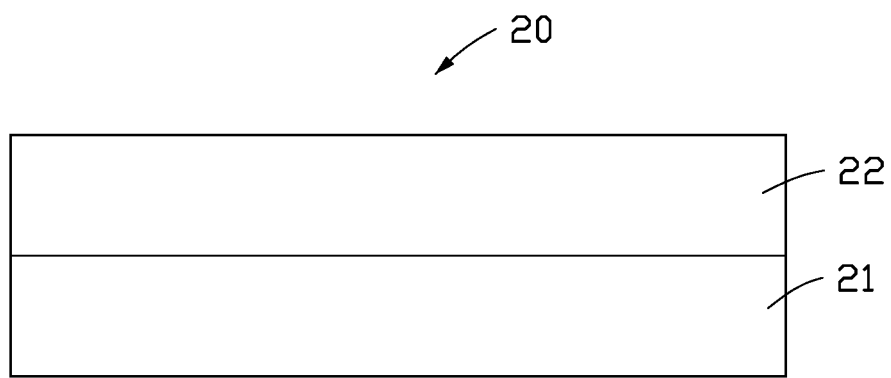
FIG. 2 is a schematic diagram of a display panel in the holographic display device shown in FIG. 1.

Referring to FIG. 2, the display panel 20 includes a light source 21 and a filter layer 22. The light source 21 is configured to emit at least a first color light and a second color light. The filter layer 22 is located on optical paths of the first color light and the second color light. The filter layer 22 is configured to filter the first color light and the second color light. The display panel 20 may further includes some other components, such as a liquid crystal layer on a side of the filter layer 22 away from the light source 21, etc. Only components related to the present embodiment will be described here.

The light source 21 of the present embodiment is configured to emit the first color light, the second color light, and a third color light. In the present embodiment, the first color light is blue light, the second color light is green light, and the third color light is red light. In other embodiments, the first color light, the second color light, and the third color light may be other colors. In another embodiment, the light source 21 may be configured to emit a fourth color light. The fourth color light may be white light.

Figure 3:
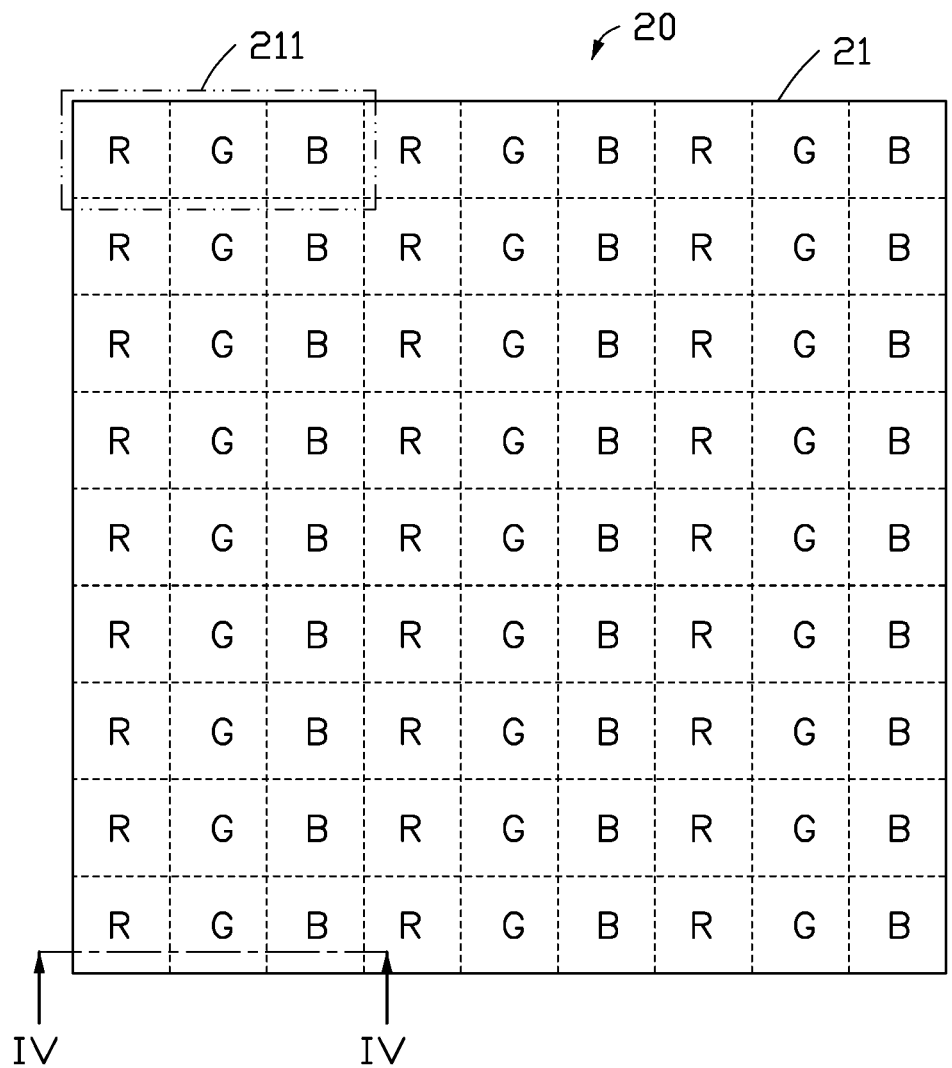
FIG. 3 is a schematic diagram of an arrangement of pixels in the holographic display device shown in FIG. 1.

Referring to FIG. 3, the light source 21 defines a plurality of pixel areas 211. The plurality of pixel areas 211 are arranged in an array. The first color light, the second color light, and the third color light are emitted from each of the pixel areas 211. Each of the pixel areas 211 includes three sub-pixel areas that are a sub-pixel area R, a sub-pixel area G, and a sub-pixel area B. The first color light (blue light) is emitted from the sub-pixel area B. The second color light (green light) is emitted from the sub-pixel area G. The third color light (red light) is emitted from the sub-pixel area R.

Figure 4:
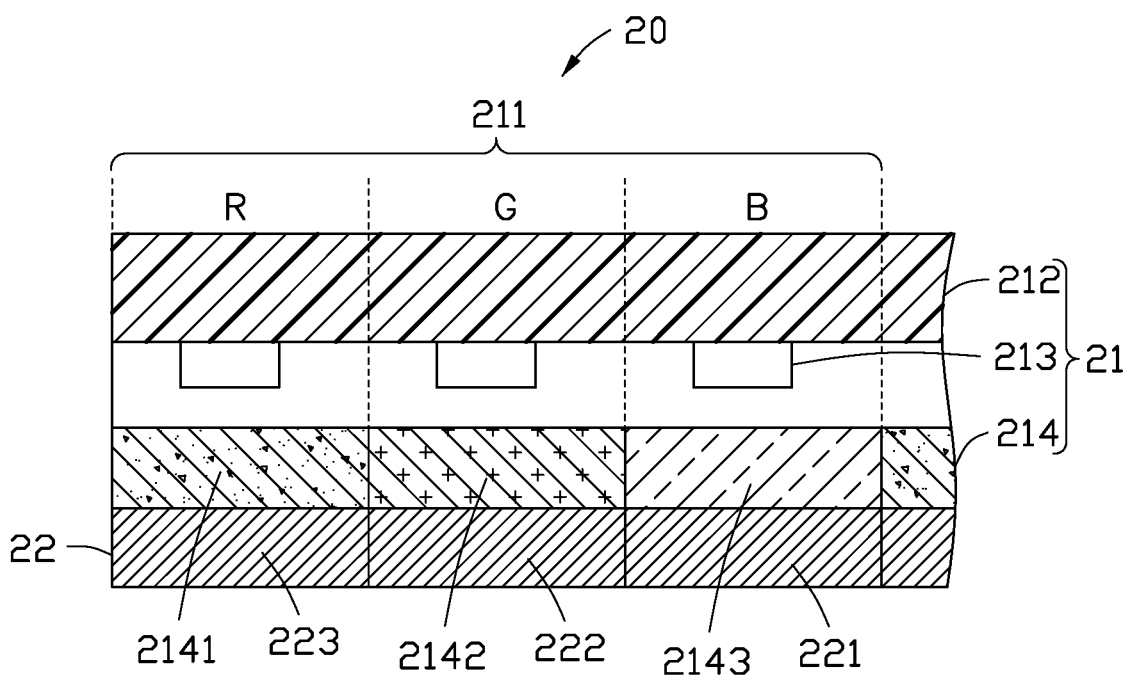
FIG. 4 is a cross-sectional view along line IV-IV of FIG. 3.

Referring to FIG. 4, the light source 21 includes a substrate 212, a plurality of light-emitting elements 213 located on a same surface of the substrate 212, and a color conversion layer 214 located on optical paths of the plurality of light-emitting elements 213.

In the present embodiment, each of the light-emitting elements 213 is a micro light-emitting diode (Micro-LED) for emitting the blue light (that is, the first color light). In other embodiments, each of the light-emitting elements 213 may be an organic light-emitting diode (OLED). A driving circuit may be provided on the substrate 212 to drive each of the light-emitting elements 213 to emit light.

Referring to FIG. 4, the color conversion layer 214 is between the plurality of light-emitting elements 213 and the filter layer 22. The color conversion layer 214 converts a portion of the blue light from the light-emitting element 213 into green light, and a portion of the blue light from the light-emitting element 213 into red light. The color conversion layer 214 emits the green light and the red light to the filter layer 22. The color conversion layer 214 also transmits unconverted blue light.

Referring to FIG. 4, the color conversion layer 214 includes a plurality of first conversion units 2141, a plurality of second conversion units 2142, and a plurality of transmission units 2143. Each of the first conversion units 2141 converts the portion of the blue light from one of the pixel areas 211 into the red light. Each of the second conversion units 2142 converts the portion of the blue light from one of the pixel areas 211 into the green light. In the present embodiment, each of the first conversion units 2141 includes quantum dots to convert the portion of the blue light into the red light, and each of the second conversion units 2142 includes quantum dots to convert the portion of the blue light into the green light. Each of the transmission units 2143 directly transmits the blue light from one of the pixel areas 211.

In another embodiment, some of the light-emitting elements 213 emit the first color light, some of the light-emitting elements 213 emit the second color light, and the other of the light-emitting elements 213 emit the third color light, where the light source 21 does not include the color conversion layer 214.

Referring to FIG. 4, the filter layer 22 is configured to filter out the blue light, the red light, and the green light from the color conversion layer 214. That is, the filter layer 22 transmits light which is only in a specific wavelength range of the blue light, the red light, and the green light.

Referring to FIG. 4, the filter layer 22 includes a plurality of first filter units 221, a plurality of second filter units 222, and a plurality of third filter units 223. Each of the first filter units 221, each of the second filter units 222, and each of the third filter units 223 are independent color filters. Each of the first filter units 221 located in one of the three sub-pixel areas emits the blue light. Each of the second filter units 222 located in one of the three sub-pixel areas emits the green light. Each of the third filter units 223 located in one of the three sub-pixel areas emits the red light. There is one first filter unit 221, one second filter unit 222, and one third filter unit 223 in each of the pixel areas 211.

Each of the first filter units 221 selectively transmits the blue light in a continuous first target wavelength range. Each of the second filter units 222 selectively transmits the green light in a continuous second target wavelength range. Each of the third filter units 223 selectively transmits the red light in a continuous third target wavelength range. The first color light from the light source 21 has a first wavelength range, the second color light from the light source 21 has a second wavelength range, and the third color light from the light source 21 has a third wavelength range. The first target wavelength range is less than the first wavelength range as emitted, the second target wavelength range is less than the second wavelength range, and the third target wavelength range is less than the third wavelength range. In the present embodiment, the first wavelength range, the second wavelength range, and the third wavelength range are reduced to 24 nm.

In the present embodiment, the first color light from the light source 21 has a first peak wavelength and a first center wavelength. The first peak wavelength and the first center wavelength are within the first target wavelength range. The second color light from the light source 21 has a second peak wavelength and a second center wavelength. Both the second peak wavelength and the second center wavelength are within the second target wavelength range. The third color light from the light source 21 has a third peak wavelength and a third center wavelength. The third peak wavelength and the third center wavelength are within the third target wavelength range.

Therefore, the coherence of the light source 21 is improved, which improves the display effect of the holographic display device 10.

It is to be understood, even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A display panel comprising:
   a light source configured to emit a first color light and a second color light; and
   a filter layer located on an optical path of the first color light and an optical path of the second color light,
   wherein the filter layer comprises a plurality of first filter units and a plurality of second filter units, each of the plurality of first filter units is configured to filter the first color light, each of the plurality of second filter units is configured to filter the second color light, the first color light has a first wavelength range, the second color light has a second wavelength range, the first color light after filtering by the plurality of first filter units has a first target wavelength range that is less than the first wavelength range, the second color light after filtering by the plurality of second filter units has a second target wavelength range that is less than the second wavelength range.

2. The display panel of claim 1, wherein the light source defines a plurality of pixel areas, at least the first color light and the second color light are emitted from each of the plurality of pixel areas;
   one of the plurality of first filter units and one of the plurality of second filter units are located on each of the plurality of pixel areas, wherein the first filter unit is located on the optical path of the first color light from the pixel area, the second filter unit is located on the optical path of the second color light from the pixel area.

3. The display panel of claim 2, wherein the light source comprises:
   a plurality of light-emitting elements, wherein each of the plurality of light-emitting elements is configured to emit the first color light; and
   a color conversion layer between the plurality of light-emitting elements and the filter layer,
   wherein the color conversion layer is configured to convert a portion of the first color light into the second color light and transmit other portion of the first color light.

4. The display panel of claim 3, wherein the first color light is blue light.

5. The display panel of claim 3, wherein the color conversion layer comprises a plurality of first conversion units and a plurality of transmission units;
   each of the plurality of first conversion units is configured to convert the portion of the first color light from one of the plurality of pixel areas into the second color light, each of the plurality of transmission units is configured to transmit the other portion of the first color light that is unconverted.

6. The display panel of claim 5, wherein each of the plurality of first conversion units comprises quantum dots to convert the portion of the first color light into the second color light.

7. The display panel of claim 3, wherein a third color light is emitted from each of the plurality of pixel areas, the filter layer further comprises a plurality of third filter units, each of the plurality of third filter units is configured to filter the third color light.

8. The display panel of claim 7, wherein the color conversion layer comprises a plurality of first conversion units, a plurality of second conversion units, and a plurality of transmission units; each of the plurality of first conversion units is configured to convert the portion of the first color light into the second color light; each of the plurality of second conversion units is configured to convert a portion of the first color light into the third color light; and each of the plurality of transmission units is configured to transmit the other portion of the first color light.

9. The display panel of claim 1, wherein the first color light has a first center wavelength and a first peak wavelength, the first center wavelength and the first peak wavelength are within the first target wavelength range; the second color light has a second center wavelength and a second peak wavelength, the second center wavelength and the second peak wavelength are within the second target wavelength range.

10. A holographic display device comprising:
a display panel, wherein the display panel comprises:
a light source configured to emit at least a first color light and a second color light; and
a filter layer located on an optical path of the first color light and an optical path of the second color light, the filter layer comprises a plurality of first filter units and a plurality of second filter units, each of the plurality of first filter units is configured to filter the first color light, each of the plurality of second filter units is configured to filter the second color light, the first color light has a first wavelength range, the second color light has a second wavelength range, the first color light after filtering by the plurality of first filter units has a first target wavelength range that is less than the first wavelength range, the second color light after filtering by the plurality of second filter units has a second target wavelength range that is less than the second wavelength range; and
a modulator located on the optical path of the first color light and the optical path of the second color light, wherein the modulator is configured to modulate the first color light and the second color light from the display panel to generate holographic images.

11. The holographic display device of claim 10, wherein the light source defines a plurality of pixel areas, at least the first color light and the second color light are emitted from each of the plurality of pixel areas; one of the plurality of first filter units and one of the plurality of second filter units are located on each of the plurality of pixel areas, wherein the first filter unit is located on the optical path of the first color light from the pixel area, the second filter unit is located on the optical path of the second color light from the pixel area.

12. The holographic display device of claim 11, wherein the light source comprises:
a plurality of light-emitting elements, wherein each of the plurality of light-emitting elements is configured to emit the first color light; and
a color conversion layer between the plurality of light-emitting elements and the filter layer, wherein the color conversion layer is configured to convert a portion of the first color light into the second color light and transmit other portion of the first color light.

13. The holographic display device of claim 12, wherein the first color light is blue light.

14. The holographic display device of claim 12, wherein the color conversion layer comprises a plurality of first conversion units and a plurality of transmission units;
each of the plurality of first conversion units is configured to convert the portion of the first color light from one of the plurality of pixel areas into the second color light, each of the plurality of transmission units is configured to transmit the other portion of the first color light that is unconverted.

15. The holographic display device of claim 14, wherein each of the plurality of first conversion units comprises quantum dots to convert the portion of the first color light into the second color light.

16. The holographic display device of claim 12, wherein a third color light is emitted from each of the plurality of pixel areas, the filter layer further comprises a plurality of third filter units, each of the plurality of third filter units is configured to filter the third color light.

17. The holographic display device of claim 16, wherein the color conversion layer comprises a plurality of first conversion units, a plurality of second conversion units, and a plurality of transmission units; each of the plurality of first conversion units is configured to convert the portion of the first color light into the second color light; each of the plurality of second conversion units is configured to convert a portion of the first color light into the third color light; and each of the plurality of transmission units is configured to transmit the other portion of the first color light.

18. The holographic display device of claim 10, wherein the first color light has a first center wavelength and a first peak wavelength, the first center wavelength and the first peak wavelength are within the first target wavelength range;
the second color light has a second center wavelength and a second peak wavelength, the second center wavelength and the second peak wavelength are within the second target wavelength range.

* * * * *